United States Patent
Song et al.

(10) Patent No.: US 9,508,946 B2
(45) Date of Patent: Nov. 29, 2016

(54) ORGANIC LIGHT EMITTING DIODE DISPLAY AND MANUFACTURING METHOD THEREOF

(71) Applicant: Samsung Display Co., Ltd., Yongin, Gyeonggi-do (KR)

(72) Inventors: Ha-Jin Song, Yongin (KR); Sang-Woo Pyo, Yongin (KR); Byeong-Wook Yoo, Yongin (KR); Ji-Young Kwon, Yongin (KR); Bum-Suk Lee, Yongin (KR); Ji-Myoung Ye, Yongin (KR); Ji-Hwan Yoon, Yongin (KR)

(73) Assignee: Samsung Display Co., Ltd., Gyunggi-do (KR)

( * ) Notice: Subject to any disclaimer, the term of this patent is extended or adjusted under 35 U.S.C. 154(b) by 116 days.

(21) Appl. No.: 13/917,544

(22) Filed: Jun. 13, 2013

(65) Prior Publication Data

US 2014/0175391 A1    Jun. 26, 2014

(30) Foreign Application Priority Data

Dec. 21, 2012   (KR) .................. 10-2012-0151259

(51) Int. Cl.
*H01L 51/50*    (2006.01)
*H01L 51/52*    (2006.01)
*H01L 27/32*    (2006.01)

(52) U.S. Cl.
CPC ........ *H01L 51/5008* (2013.01); *H01L 27/3211* (2013.01); *H01L 51/504* (2013.01); *H01L 51/5278* (2013.01)

(58) Field of Classification Search
CPC .............. H01L 51/50; H01L 51/504–51/5092
See application file for complete search history.

(56) References Cited

U.S. PATENT DOCUMENTS

| | | | |
|---|---|---|---|
| 6,650,045 B1* | 11/2003 | Forrest | H01L 51/5271 313/503 |
| 7,932,113 B1* | 4/2011 | Yee | H01L 27/3211 257/E51.022 |
| 8,053,975 B2* | 11/2011 | Chun et al. | 313/504 |
| 8,900,675 B2* | 12/2014 | Ibe | H05B 33/10 427/557 |
| 8,922,112 B2* | 12/2014 | Kobayashi et al. | 313/504 |
| 8,981,361 B2* | 3/2015 | Ohuchi et al. | 257/40 |
| 2003/0160247 A1* | 8/2003 | Miyazawa | H05B 33/22 257/79 |
| 2005/0162074 A1* | 7/2005 | Madathil et al. | 313/504 |
| 2005/0162075 A1* | 7/2005 | Madathil et al. | 313/504 |
| 2005/0173700 A1* | 8/2005 | Liao | H01L 27/3211 257/40 |
| 2005/0225232 A1* | 10/2005 | Boroson | H01L 51/5265 313/504 |

(Continued)

FOREIGN PATENT DOCUMENTS

| KR | 10-0731755 | 6/2007 |
|---|---|---|
| KR | 10-0782465 | 11/2007 |

(Continued)

*Primary Examiner* — Laura Menz
*Assistant Examiner* — Maliheh Malek
(74) *Attorney, Agent, or Firm* — Knobbe, Martens, Olson & Bear LLP

(57) ABSTRACT

An organic light emitting diode display includes: a substrate; a thin film transistor provided on the substrate; a first electrode connected to the thin film transistor; an organic emission layer provided on the first electrode; an interlayer provided on the organic emission layer; an electron auxiliary layer provided on the interlayer and including an electron injection layer (EIL) and an electron transport layer (ETL); and a second electrode provided on the electron auxiliary layer, wherein the interlayer is made by mixing a material of the electron auxiliary layer.

19 Claims, 5 Drawing Sheets

(56) References Cited

U.S. PATENT DOCUMENTS

| | | | | |
|---|---|---|---|---|
| 2005/0249972 A1* | 11/2005 | Hatwar et al. | | 428/690 |
| 2007/0120453 A1* | 5/2007 | Hwang | | H01L 27/3211 313/112 |
| 2007/0132381 A1* | 6/2007 | Hayashi | | H01L 51/5237 313/512 |
| 2007/0164278 A1* | 7/2007 | Lee | | H01L 51/5036 257/40 |
| 2007/0231503 A1* | 10/2007 | Hwang | | C09K 11/06 428/1.1 |
| 2007/0241664 A1* | 10/2007 | Sakamoto | | H01L 27/3276 313/503 |
| 2008/0246392 A1* | 10/2008 | Kho | | H01L 27/322 313/504 |
| 2008/0315753 A1* | 12/2008 | Liao | | C09K 11/06 313/504 |
| 2009/0051275 A1* | 2/2009 | Kobayashi et al. | | 313/504 |
| 2009/0066234 A1* | 3/2009 | Chae | | B82Y 20/00 313/504 |
| 2009/0108736 A1* | 4/2009 | Begley | | H01L 51/0052 313/504 |
| 2009/0203285 A1* | 8/2009 | Kobayashi | | H01L 27/3211 445/58 |
| 2009/0231243 A1* | 9/2009 | Song | | H01L 27/3211 345/76 |
| 2009/0278131 A1* | 11/2009 | Kwon | | H01L 27/1288 257/72 |
| 2009/0302313 A1* | 12/2009 | Choi et al. | | 257/40 |
| 2010/0007270 A1* | 1/2010 | Suh | | H01L 27/322 313/504 |
| 2010/0117936 A1* | 5/2010 | Lhee | | H01L 27/3211 345/76 |
| 2010/0171415 A1* | 7/2010 | Akamatsu | | H01L 51/5012 313/504 |
| 2010/0181559 A1* | 7/2010 | Nakatani | | H01L 27/3246 257/40 |
| 2010/0207108 A1* | 8/2010 | Herron et al. | | 257/40 |
| 2010/0213449 A1* | 8/2010 | Yamamoto | | H01L 27/3283 257/40 |
| 2010/0289728 A1* | 11/2010 | Nakatani | | H01L 51/0003 345/76 |
| 2011/0127500 A1* | 6/2011 | Ko | | H01L 27/3211 257/40 |
| 2011/0168986 A1* | 7/2011 | Lee | | C23C 14/042 257/40 |
| 2011/0186820 A1* | 8/2011 | Kim | | C23C 14/044 257/40 |
| 2011/0240970 A1* | 10/2011 | Park et al. | | 257/40 |
| 2011/0266944 A1* | 11/2011 | Song | | C23C 14/042 313/504 |
| 2011/0291122 A1* | 12/2011 | Shin et al. | | 257/88 |
| 2011/0291128 A1* | 12/2011 | Harada | | H01L 27/3246 257/88 |
| 2011/0303903 A1* | 12/2011 | Yoshinaga | | H01L 51/0056 257/40 |
| 2011/0309739 A1* | 12/2011 | Song | | H01L 51/5088 313/504 |
| 2012/0001207 A1* | 1/2012 | Lee | | H01L 51/5203 257/89 |
| 2012/0025180 A1* | 2/2012 | Matsumoto | | H01L 51/5096 257/40 |
| 2012/0056181 A1* | 3/2012 | Kamata | | H01L 21/485 257/57 |
| 2012/0097926 A1* | 4/2012 | Park | | H01L 51/0013 257/40 |
| 2012/0097956 A1* | 4/2012 | Yun et al. | | 257/59 |
| 2012/0146062 A1* | 6/2012 | Oda | | H01L 27/3211 257/88 |
| 2012/0168737 A1* | 7/2012 | Tomono | | C09K 11/06 257/40 |
| 2012/0187386 A1* | 7/2012 | Matsumi | | H01L 51/5012 257/40 |
| 2012/0187425 A1* | 7/2012 | Omoto | | H01L 27/3211 257/88 |
| 2012/0223633 A1* | 9/2012 | Yoshinaga et al. | | 313/504 |
| 2012/0286300 A1* | 11/2012 | Kijima | | H01L 51/5275 257/88 |
| 2012/0298968 A1* | 11/2012 | Kim et al. | | 257/40 |
| 2012/0319089 A1* | 12/2012 | Shin | | H01L 51/0014 257/40 |
| 2012/0320287 A1* | 12/2012 | Kim et al. | | 349/2 |
| 2013/0001531 A1* | 1/2013 | Park et al. | | 257/40 |
| 2013/0001603 A1* | 1/2013 | Lim | | H01L 51/5209 257/88 |
| 2013/0005211 A1* | 1/2013 | Shin | | H01L 27/3211 445/24 |
| 2013/0043498 A1* | 2/2013 | Pyo et al. | | 257/89 |
| 2013/0048959 A1* | 2/2013 | Song | | H01L 51/0013 257/40 |
| 2013/0048986 A1* | 2/2013 | Lee | | H01L 51/5265 257/52 |
| 2013/0092909 A1* | 4/2013 | Han | | H01L 51/5004 257/40 |
| 2013/0119357 A1* | 5/2013 | Kim et al. | | 257/40 |
| 2013/0134403 A1* | 5/2013 | Harada | | H01L 51/5088 257/40 |
| 2013/0140530 A1* | 6/2013 | Kho et al. | | 257/40 |
| 2013/0140542 A1* | 6/2013 | Harada | | H01L 27/3246 257/40 |
| 2013/0146853 A1* | 6/2013 | Lee et al. | | 257/40 |
| 2013/0161595 A1* | 6/2013 | Kim | | H01L 27/3216 257/40 |
| 2013/0168653 A1* | 7/2013 | Nam | | H01L 51/5203 257/40 |
| 2013/0207084 A1* | 8/2013 | Im et al. | | 257/40 |
| 2013/0277654 A1* | 10/2013 | Seo | | H01L 51/5262 257/40 |
| 2013/0313543 A1* | 11/2013 | Ohuchi | | H01L 51/5088 257/40 |
| 2014/0014927 A1* | 1/2014 | Kim et al. | | 257/40 |
| 2014/0027732 A1* | 1/2014 | Pyo et al. | | 257/40 |
| 2014/0070185 A1* | 3/2014 | Im | | H01L 51/5064 257/40 |
| 2014/0131674 A1* | 5/2014 | Park | | H01L 27/3209 257/40 |
| 2014/0159022 A1* | 6/2014 | Song | | H01L 27/3248 257/40 |

FOREIGN PATENT DOCUMENTS

| | | |
|---|---|---|
| KR | 10-0848339 | 7/2008 |
| KR | 10-2013-0022765 A | 3/2013 |

* cited by examiner

ORGANIC LIGHT EMITTING DIODE DISPLAY AND MANUFACTURING METHOD THEREOF

CROSS-REFERENCE TO RELATED APPLICATIONS

This application claims priority to and the benefit of Korean Patent Application No. 10-2012-0151259 filed in the Korean Intellectual Property Office on Dec. 21, 2012, the entire contents of which are incorporated herein by reference.

BACKGROUND

Field

The described technology relates generally to an organic light emitting diode (OLED) display and a manufacturing method thereof.

Description of the Related Technology

An organic light emitting diode display includes two electrodes and an organic emission layer interposed therebetween, electrons injected from a cathode that is one electrode and holes injected from an anode that is another electrode are bonded to each other in the organic emission layer to form an exciton, and light is emitted while the exciton discharges energy.

An example of a method for forming an organic emission layer in such an organic light emitting diode display to display full colors is laser induced thermal imaging (LITI).

In the laser induced thermal imaging method, a laser beam generated from a laser beam generator is patterned using a mask pattern, and the patterned laser beam is irradiated onto a donor film including a base film and a transfer layer to expand part of the transfer layer and transfer it to the organic light emitting diode display, thus forming an organic emission layer on the organic light emitting diode display. Thus, this method has advantages that each emission layer can be finely patterned and dry etching can be used.

The transfer layer is made of a single layer of the organic emission layer or a dual layer of the organic emission layer and a resonance assistance layer, and when the transfer layer is made of the single layer of the organic emission layer, thermal energy is transmitted to a hole transport layer (HTL) in the laser induced thermal imaging process such that a carrier accumulation is generated in an interface between the hole transport layer (HTL) and the organic emission layer, and thereby a characteristic of the organic light emitting element may be deteriorated.

Also, when the transfer layer is made of the dual layer of the organic emission layer and the resonance assistance layer, performance of the interface between the resonance assistance layer and the organic emission layer is improved, however the carrier accumulation is generated in the interface between the hole transport layer (HTL) and the organic emission layer such that the characteristic of the organic light emitting element may be deteriorated.

Further, thermal damage to the resonance assistance layer and the hole transport layer (HTL) is serious because of the thermal energy generated when using the laser induced thermal imaging such that the driving voltage may be excessively increased.

In addition, when using the laser induced thermal imaging, heat is transmitted to the anode such that the interface characteristic between the anode and the hole injection layer (HIL) may be deteriorated.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode (OLED) display for minimizing thermal damage at a boundary between a transfer layer and a hole transport layer (HTL) caused by a laser induced thermal imaging method, and a manufacturing method thereof.

The described technology has been made in an effort to provide an organic light emitting diode (OLED) display for efficiently moving electrons to a transfer layer from an electron transport layer (ETL), and a manufacturing method thereof.

An example embodiment provides an organic light emitting diode display, including: a substrate; a thin film transistor provided on the substrate; a first electrode connected to the thin film transistor; an organic emission layer provided on the first electrode; an interlayer provided on the organic emission layer; an electron auxiliary layer provided on the interlayer and including an electron injection layer (EIL) and an electron transport layer (ETL); and a second electrode provided on the electron auxiliary layer, wherein the interlayer is made by mixing a material of the electron auxiliary layer.

The organic light emitting diode display further includes a hole electron auxiliary layer between the first electrode and the organic emission layer.

The interlayer is formed by mixing the electron injection material of the electron injection layer (EIL) and the electron transfer material of the electron transport layer (ETL) with the ratio of 2:8 to 8:2.

The electron transport layer (ETL) and the electron injection layer (EIL) include at least one of tris(8-hydroxyquinolino)aluminum (Alq3), PBD, TAZ, spiro-PBD, BAlq, SAlq, 2,9-dimethyl-4,7-diphenyl-1,10-phenanthroline (BCP), and 4,7-diphenyl-1,10-phenanthroline (Bphen).

Another embodiment provides an organic light emitting diode display including: a substrate; a thin film transistor provided on the substrate; a first electrode connected to the thin film transistor; an organic emission layer provided on the first electrode; an interlayer provided on the organic emission layer; an electron auxiliary layer provided on the interlayer; and a second electrode provided on the electron auxiliary layer, wherein the interlayer is a mixture of a host material of the organic emission layer and the electron auxiliary layer.

The electron auxiliary layer includes an electron transport layer (ETL) and an electron injection layer (EIL).

The host material and the electron transport layer (ETL) are mixed at a ratio of 2:8 to 8:2.

Yet another embodiment provides a method for manufacturing an organic light emitting diode display, including: forming a thin film transistor and a first electrode on a substrate; forming a donor film including a base film and a transfer layer; transferring the transfer layer of the donor film to a first electrode of the substrate by using laser beams; forming an electron auxiliary layer on the transfer layer; and forming a second electrode on the electron auxiliary layer, wherein the transfer layer includes an organic emission layer and an interlayer formed on the organic emission layer.

The electron auxiliary layer includes an electron transport layer (ETL) and an electron injection layer (EIL).

The interlayer is formed by mixing an electron injection material of the electron injection layer (EIL) and an electron transfer material of the electron transport layer (ETL) at a ratio of 2:8 to 8:2.

The interlayer is formed with a mixture of an electron injection material of the electron injection layer (EIL) and a host material of the organic emission layer.

The interlayer is formed by mixing the electron injection material of the electron injection layer (EIL) and the host material of the organic emission layer at a ratio of 2:8 to 8:2.

According to the example embodiments, thermal damage to the organic emission layer caused by heat energy is minimized by forming an interlayer in the laser induced thermal imaging process.

Therefore, the thermal damage is minimized to prevent an abnormal increase of the driving voltage and improve reliability of products.

DETAILED DESCRIPTION

Figure 1:
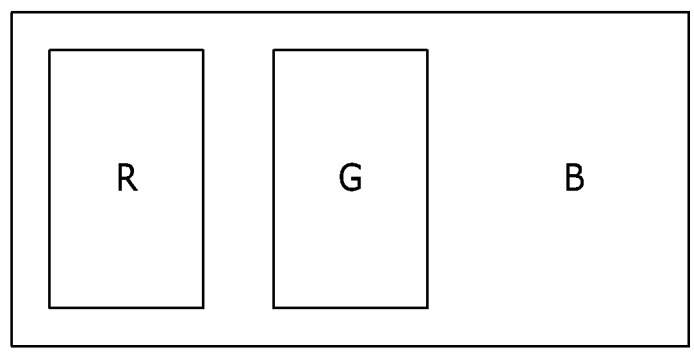
FIG. 1 shows a top plan view of a disposition of a pixel of an organic light emitting diode (OLED) display according to an example embodiment.

The present embodiments will be described more fully hereinafter with reference to the accompanying drawings, in which example embodiments are shown. As those skilled in the art would realize, the described embodiments may be modified in various different ways, all without departing from the spirit or scope of the present embodiments.

Like reference numerals designate like elements throughout the specification.

Further, the size and thickness of each component shown in the drawings are arbitrarily shown for better understanding and ease of description, but the present embodiments are not limited thereto.

An organic light emitting diode (OLED) display according to an example embodiment will now be described with reference to FIG. 1 to FIG. 3.

FIG. 1 shows a top plan view of a disposition of a pixel of an organic light emitting diode (OLED) display according to an example embodiment.

As shown in FIG. 1, the organic light emitting diode (OLED) display includes a red pixel (R) for displaying red, a green pixel (G) for displaying green, and a blue pixel (B) for displaying blue. The red, green, and blue are examples of primary colors for expressing full colors, and the red pixel (R), the green pixel (G), and the blue pixel (B) can be primary pixels for expressing full colors. The three pixels configure a single group of repeating rows and columns.

In detail, regarding disposition of the red pixel (R), the green pixel (G), and the blue pixel (B), a plurality of red pixels (R), a plurality of green pixels (G), and a plurality of blue pixels (B) are alternately arranged along the rows. The red pixel (R), the green pixel (G), and the blue pixel (B) may substantially have equivalent areas.

In FIG. 1, the area of the blue pixel (B) is shown to surround the red pixel (R) and the green pixel (G), which shows that the blue organic emission layer is formed in the area of the blue pixel (B) and the entire surface. Forms and dispositions of the pixel are changeable in various ways, and other pixels including a white pixel for expressing white can be further included.

One pixel of the organic light emitting diode (OLED) display according to an example embodiment will now be described with reference to FIG. 1 and FIG. 2.

Figure 2:
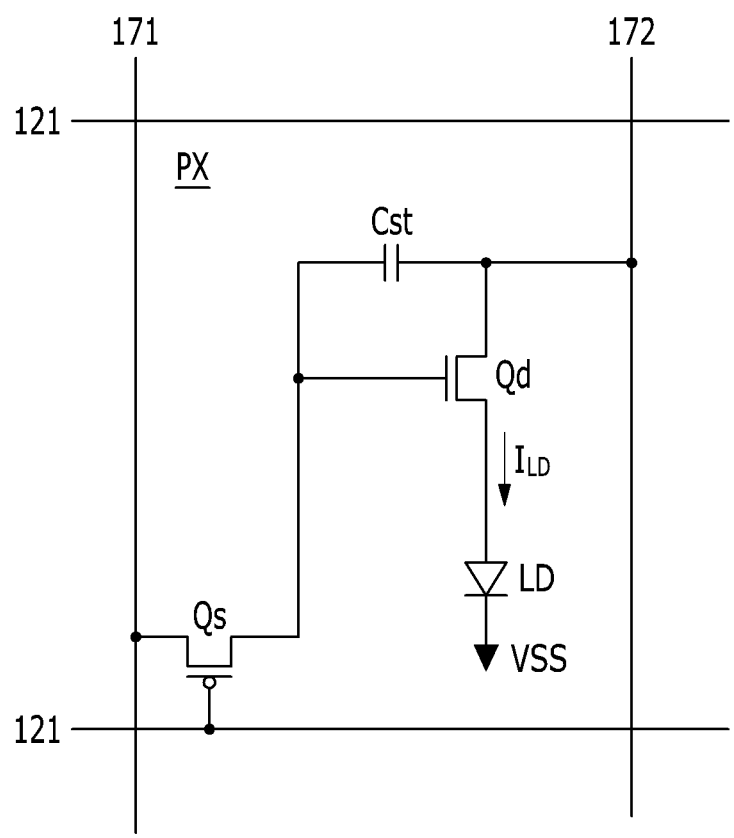
FIG. 2 shows an equivalent circuit diagram of a pixel of an organic light emitting diode (OLED) display according to an example embodiment.

FIG. 2 shows an equivalent circuit diagram of a pixel of an organic light emitting diode (OLED) display according to an example embodiment.

Referring to FIG. 2, the organic light emitting diode (OLED) display includes a plurality of signal lines 121, 171, and 172, and a pixel (PX) connected thereto. The pixel (PX) can be one of the red pixel (R), the green pixel (G), and the blue pixel (B) shown in FIG. 1.

The signal lines include a scan signal line 121 for transmitting a gate signal (or a scan signal), a data line 171 for transmitting a data signal, and a driving voltage line 172 for transmitting a driving voltage. The scan signal line 121 is substantially provided in a row direction, and the data line 171 is substantially provided in a column direction. The driving voltage line 172 is shown to be substantially provided in a column direction, and it can be provided in the row direction or the column direction or it can be formed to have a fishnet shape.

One pixel (PX) includes a switching transistor (Qs), a driving transistor (Qd), a storage capacitor (Cst), and an organic light emitting element (LD).

The switching transistor (Qs) includes a control terminal, an input terminal, and an output terminal, and in detail, the control terminal is connected to the scan signal line 121, the input terminal is connected to the data line 171, and output terminal is connected to the driving transistor (Qd). The switching transistor (Qs) transmits the data signal provided by the data line 171 to the driving transistor (Qd) in response to the scan signal provided by the scan signal line 121.

The driving transistor (Qd) includes a control terminal, an input terminal, and an output terminal, and in detail, the control terminal is connected to the switching transistor (Qs), the input terminal is connected to the driving voltage line 172, and the output terminal is connected to the organic light emitting element (LD). The driving transistor (Qd) outputs an output current (ILD) that is variable by a voltage between the control terminal and the output terminal.

The capacitor (Cst) is connected between the control terminal of the driving transistor (Qd) and the input terminal. The capacitor (Cst) charges the data signal applied to the control terminal of the driving transistor (Qd), and maintains the same after the switching transistor (Qd) is turned off.

The organic light emitting element (LD) is exemplarily an organic light emitting diode (OLED), and it includes an anode connected to the output terminal of the driving transistor (Qd) and a cathode connected to a common voltage (Vss). The organic light emitting element (LD) displays an image by differentiating intensity according to an output current (ILD) of the driving transistor (Qd) and emitting light. The organic light emitting element (LD) included an organic material for properly emitting one or at least one of the primary colors (red, green, and blue), and the organic light emitting diode (OLED) display displays the desired image with a spatial sum of the colors.

A cross-sectional configuration of an organic light emitting diode (OLED) display according to an example embodiment will now be described with reference to FIG. 2 and FIG. 3.

Figure 3:
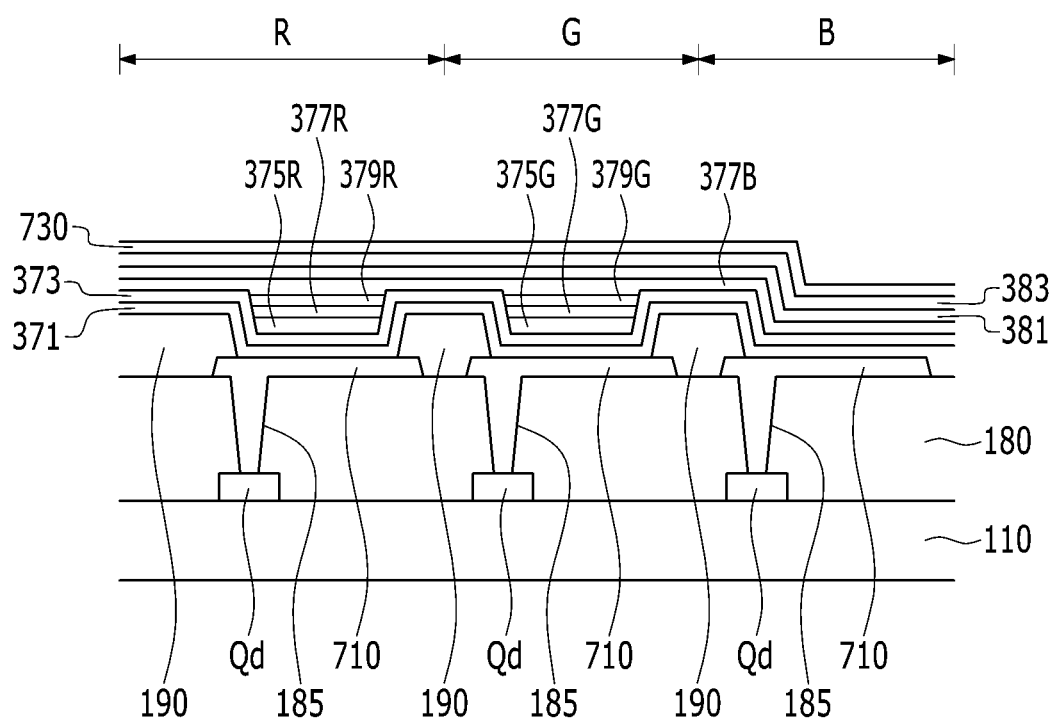
FIG. 3 shows a cross-sectional view of three pixels of an organic light emitting diode (OLED) display according to an example embodiment.

FIG. 3 shows a cross-sectional view of three pixels of an organic light emitting diode (OLED) display according to an example embodiment.

As shown in FIG. 3, in the organic light emitting diode (OLED) display, a plurality of driving transistors (Qd) are formed on an insulation substrate 110 made of transparent glass or plastic. In addition to this, a plurality of signal lines (not shown) and a plurality of switching transistors (not shown) can be formed on the insulation substrate 110.

A protective layer 180 made of an inorganic or organic material is formed on the driving transistor (Qd). When the protective layer 180 is made of an organic material, its surface can be flat.

A contact hole 185 for revealing a part of the driving transistor (Qd) is formed on the protective layer 180.

A first electrode 710 is formed on the protective layer 180 of the pixels (R, G, and B). The first electrode 710 is made of a transparent conductive oxide such as indium tin oxide (ITO) or indium zinc oxide (IZO).

The first electrode 710 further includes a reflection layer (not shown) made of a reflective material, and the reflection layer is made of a metal having high reflectivity such as silver (Ag) or aluminum (Al), or an alloy thereof.

A pixel definition layer 190 for covering an edge of the first electrode 710 is formed on the protective layer 180.

In the red, green, and blue pixels (R, G, and B), a hole injection layer (HIL) 371 and a hole transport layer (HTL) 373 are sequentially stacked on the first electrode 710.

The hole injection layer (HIL) 371 is made of copper phthalocyanine (CuPc), N,N'-diphenyl-N,N'-di-[4-(N,N-ditolil-amino)phenyl]benzidine (NTNPB), poly 3,4-ethylenedioxythiophene (PEDOT), polyaniline (PANI), or N,N'-diphenyl-N,N'-di-[4-N,N-diphenyl-amino)phenyl]benzidine (NPNPB), and it is not restricted thereto.

The hole transport layer (HTL) 373 is made of N,N-dinaphthyl-N,N'-diphenyl benzidine (NPD), 4,4',4"-tris(N-3-methylphenyl-N-phenyl-amino)-triphenylamine (MT-DATA), N,N'-bis(naphthalen-1-yl)-N,N'-bis(phenyl)-benzidine (NPB), or N,N'-bis(3-methylphenyl)-N,N'-bis(phenyl) (TPD), and it is not restricted thereto.

A red resonance auxiliary layer 375R and a green resonance auxiliary layer 375G are formed on the hole transport layer (HTL) 373 of the red pixel (R) and the hole transport layer (HTL) 373 of the green pixel (G).

The red resonance auxiliary layer 375G is thicker than the green resonance auxiliary layer 375G. The red resonance auxiliary layer 375G and the green resonance auxiliary layer 375G are added to control a resonance distance for each color, and they can be made with the same material as the hole transport layer (HTL) 373. When the material of the hole transport layer (HTL) 373 becomes thicker, the current amount does not need to be increased, so the material may be appropriate for the resonance auxiliary layers 375R and 375G for controlling the resonance distance.

A red organic emission layer 377R and a red interlayer 379R are stacked on the red resonance auxiliary layer 375G of the red pixel (R), and a green organic emission layer 377G and a green interlayer 379R are stacked on the green resonance auxiliary layer 375G of the green pixel (G). A blue organic emission layer 377B is stacked on the red and green organic emission layers 377R and 377G and the hole transport layer (HTL) 373 of the blue pixel (B). The red, green, and blue organic emission layers 377R, 377G, and 377B are made of organic materials respectively emitting red, green, and blue light.

To prevent color mixing, an organic light emitting material having a characteristic in which hole mobility of hosts of the red organic emission layer 377R and the green organic emission layer 377G is less than hole mobility of a host of the blue organic emission layer 377B is used so that electrons and holes in the red pixel and the green pixel (R and G) may be combined on the red organic emission layer 377R and the green organic emission layer 377G to emit light, and thicknesses of the organic emission layers 377R, 377G, and 377B are controlled.

The red and green organic emission layers 377R and 377G include a phosphorescent host, a fluorescent host, a phosphorescent dopant, and a fluorescent dopant.

For the above-noted host, 4,4'-bis(carbazol-9-yl)biphenyl (CBP), 9,10-di(naphth-2-yl) anthracene (ADN), 1,3,5-tris (N-phenylbenzimiazole-2-yl)benzene (TPBI), 2-tert-butyl-9,10-di (2-naphthyl)anthracene (TBADN), 1,3-bis(carbazol-9-yl)benzene (MCP), or 1,3,5-tris(carbazol-9-yl)benzene (TCP) are used, and the host is not limited thereto.

Pt(II) octaethylporphine (PtOEP), tris(1-phenylisoquinoline) iridium(III) (Ir(piq)$_3$), or bis(2-benzo[b]thiophen-2-yl-pyridine(Ir(btp)$_2$(acac)) is usable for the red dopant, tris(2-phenylpyridine)iridium(Ir(ppy)$_3$) or acetylacetonatobis(2-phenylpyridine)iridium(Ir(ppy)$_2$(acac)) is usable for the green dopant, and bis[2-(4,6-difluorophenyl)pyridinato-N, C2']iridium picolinate (F$_2$Irpic), (F$_2$ppy)$_2$Ir(tmd), tris[1-(4, 6-difluorophenyl)pyrazolate-N,C2']iridium (Ir(dfppz)$_3$), 4,4'-bis(2,2-diphenylvinyl)-1,1'-biphenyl (DPVBi), 4,4-bis [4-(di-p-tolylamino)styryl]biphenyl (DPAVBi), or 2,5,8,11-tetra-tert-butylperylene (TBPe) is usable for the blue dopant, and they are not limited thereto.

The blue organic emission layer 377B is provided on the substrate including the green organic emission layer 377G and the red organic emission layer 377R, and an electron transport layer (ETL) 381 and an electron injection layer (EIL) 383 are sequentially stacked on the blue organic emission layer 377B.

The electron transport layer (ETL) 381 and the electron injection layer (EIL) 383 include at least one of tris(8-hydroxyquinolino)aluminum (Alq3), PBD, TAZ, spiro-PBD, BAlq, SAlq, 2,9-dimethyl-4,7-diphenyl-1,10-phenanthroline (BCP), and 4,7-diphenyl-1,10-phenanthroline (Bphen), and they are not restricted thereto.

The organic emission layer is formed by using a transfer method using a donor film, and the interlayers 379R and 379G are provided between the organic emission layer of the donor film and the heat transfer layer to minimize thermal damage to the organic emission layer caused by heat energy during the laser induced thermal imaging process and improve an interface characteristic of a boundary between the electron transport layer (ETL) and the organic emission layer.

Since the thermal damage to the organic emission layer is minimized, the life-span of the organic emission layer is increased and product reliability is improved.

The interlayer is formed inclusive of an electron transfer material and an electron injection material, and the electron transfer material having a low electron injection barrier and the electron injection material having high electron injection performance and poor electron transfer performance are mixed to control the amount of electrons caused by light emission and reduce residual electrons not caused by light emission, thereby improving the life-span.

When a ratio of the electron injection material is high, the life-span is increased, and when it is included at more than a predetermined level, a life-span overshoot phenomenon occurs to increase the driving voltage. Therefore, the electron injection material of the interlayer and the electron transfer material are mixed with the ratio 2:8 to 8:2. The hole injection layer (HIL) 371, the hole transport layer (HTL) 373, the electron transport layer (ETL) 381, and the electron injection layer (EIL) 383 improve luminous efficiency of the organic emission layers 377R, 377G, and 377B, the hole transport layer (HTL) 373 and the electron transport layer (ETL) 381 control the balance between the electrons and the holes, and the hole injection layer (HIL) 371 and the electron injection layer (EIL) 383 reinforce injection of the electrons and the holes.

The hole injection layer (HIL) 371, the hole transport layer (HTL) 373, the resonance auxiliary layers 375G and 375B, the organic emission layers 377R, 377G, and 377B, the interlayers 379R and 379G, the electron transport layer (ETL) 381, and the electron injection layer (EIL) 383 form an organic light emitting member 720.

A second electrode 730 for transmitting the common voltage (Vss) is formed on the electron injection layer (EIL) 383. The second electrode 730 includes a bottom layer and a top layer, and it has a transflective characteristic to partially reflect light and partially transmit it. The bottom layer and the top layer are made of a metal that reflects light, and when they are made thinner, they have the transflective characteristic to reflect incident light or transmit it. The second electrode 730 can also be formed as a single film.

An encapsulation layer (not shown) is formed on the second electrode 730. The encapsulation layer encapsulates the organic light emitting member 720 and the second electrode 730 to prevent permeation of external moisture or oxygen.

In the organic light emitting diode (OLED) display, the first electrode 710, the organic light emitting member 720, and the second electrode 730 form the organic light emitting element (LD). The first electrode 710 receives a voltage from the driving transistor (Qd) through the contact hole 185 of the protective layer 180.

The organic light emitting diode (OLED) display transmits light to the second electrode 730 to display the image. The light output to the second electrode 730 from the organic emission layers 377R, 377G, and 377B reaches the second electrode 730, it partially transmits through the second electrode 730, and it is partially reflected and transmitted to the first electrode 710. The first electrode 710 reflects the light and transmits it to the second electrode 730. The light traveling between the first electrode 710 and the second electrode 730 generates interference, and the light with a wavelength of the distance between the first electrode 710 and the second electrode 730 that may cause resonance generates constructive interference to increase intensity and the light with other wavelengths generates destructive interference to reduce the intensity. Such traveling and interference of light is called a microcavity effect.

The top emission method has been described in the above, in which the first electrode 710 has a reflection layer, the second electrode 730 has a transflective characteristic, and the light is output through the second electrode 730, and an organic light emitting diode (OLED) display according to a bottom emission method in which the reflection layer of the first electrode 710 is replaced with a transflective layer, the second electrode 730 is made thick to reflect the light, and the light is allowed to transmit through the substrate 110 can be acquired.

A method for manufacturing an organic light emitting diode (OLED) display according to an example embodiment will now be described with reference to FIG. 4.

Figure 4:
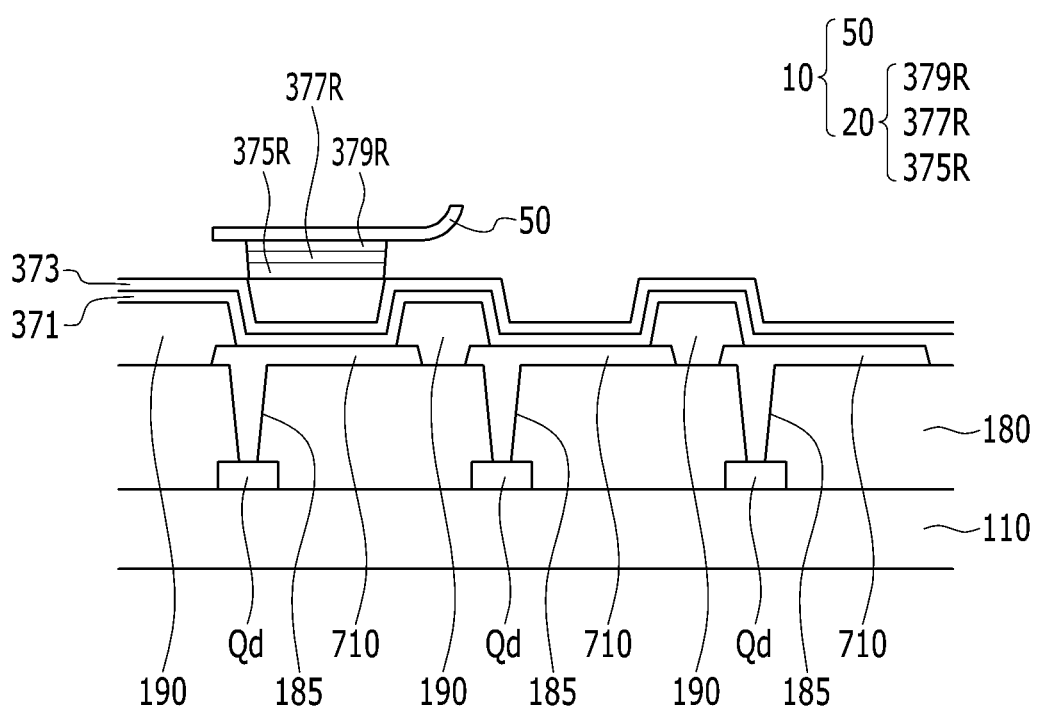
FIG. 4 shows a process for transferring a donor film on a hole transport layer (HTL) according to a method for manufacturing an organic light emitting diode (OLED) display according to an example embodiment.

FIG. 4 shows a process for transferring a donor film on a hole transport layer (HTL) according to a method for manufacturing an organic light emitting diode (OLED) display according to an example embodiment.

As shown in FIG. 3, a plurality of driving transistors (Qd) are formed on the insulation substrate 110, and a protective layer 180 having a plurality of contact holes 185 is formed thereon.

A first electrode 710 is formed on a protective layer 180 of the respective pixels (R, G, and B).

A hole injection layer (HIL) 371 and a hole transport layer (HTL) 373 are sequentially stacked.

As shown in FIG. 4, a donor film 10 on which a red organic emission layer 377R is formed is disposed on the hole transport layer (HTL) 373 of the substrate 110 on which the first electrode 710 is formed. The donor film 10 has a configuration in which a base film 50 and a transfer layer 20 are sequentially stacked.

The base film 50 is made of a material that has transparency for transmitting light to a light-to-heat conversion (LTHC) layer and that has an appropriate optical property and sufficient mechanical stability. For example, the base film 50 is made of at least one polymer material selected from polyester, polyacryl, polyepoxy, polyethylene, polystyrene, and polyethylene terephthalate, or of glass.

The light-to-heat conversion (LTHC) layer can be formed between the base film 50 and the transfer layer 20, it absorbs light in a range from infrared rays to visible rays and partially converts the light into heat, it must have appropriate optical density, and it desirably includes a light absorbing material. In this instance, the light-to-heat conversion (LTHC) layer is a metal film made of Al, Ag, or their oxides and sulfides, or an organic film made of a polymer including carbon black, graphite, or an infrared dye.

The transfer layer 20 is separated from the donor film 10 and is transferred to the substrate 110 on which the hole transport layer (HTL) 373 is formed by the heat energy provided by the light-to-heat conversion (LTHC) layer, and it has a configuration in which an interlayer, a red organic emission layer 377R, and a red resonance auxiliary layer 375R are sequentially stacked.

The transfer layer 20 uniformly laminates the red resonance auxiliary layer 375R on the hole transport layer (HTL) 373 in the red light emitting area of the donor film 10. The transfer layer 20 irradiates laser beams to the donor film 10 attached to the hole transport layer (HTL) 373 to transfer the transfer layer 20 of the donor film 10 to the substrate 110. Therefore, the red resonance auxiliary layer 375R, the red organic emission layer 377R, and the interlayer 379R are sequentially stacked on the hole transport layer (HTL) 373 of the substrate 110.

In the laser induced thermal imaging process, the interlayer 379R is provided between the red emission layer of the donor film 10 and the light-to-heat conversion (LTHC) layer to transfer laser beams to the hole transport layer (HTL) 373 and thereby minimize thermal damage to the red emission layer caused by heat energy.

In this instance, when the interlayer 379R is formed, transmission of heat of the laser beams to the organic emission layer is blocked.

When the interlayer 379R includes an electron transfer material and an electron injection material, the residual electrons that are not caused by light emission are reduced to improve the life-span by controlling the amount of electrons that are caused by light emission of the emission layer inclusive of the electron transport layer (ETL) material with poor electron transfer performance and excellent electron injection performance and the electron injection layer (EIL) material with excellent electron transfer performance and poor electron injection performance.

Also, when the host material of the organic emission layer is mixed with the electron injection material, the interlayer can be formed by reducing the mixing ratio of the electron injection material compared to the case of mixing the electron transfer material and the electron injection material. This is because the host material having the same characteristic as the LUMO level of the organic emission layer is provided on the interlayer to allow the electrons to fluently move to the organic emission layer, and the host material has electron transfer performance that is similar to that of the electron transfer material. For example, when the electron transfer material and the electron injection material are mixed with a ratio of 4:6 to form the interlayer, the host material and the electron injection material can be mixed with a ratio of 5:5.

When the electron injection material is increased, the life-span is improved, and when the increase is excessive, an overshoot occurs to increase the driving voltage. Therefore, the electron injection material and the electron transfer material can be injected with a ratio of 2:8 to 8:2.

By the same process as described above, a green resonance auxiliary layer 375G, a green organic emission layer 377G, and an interlayer 379G are formed. In this case, in the laser induced thermal imaging process, the interlayer 379G of the donor film 10 is formed and the green organic emission layer 377G is transferred to thus minimize the thermal damage to the green resonance auxiliary layer 375G and the green organic emission layer 377G caused by heat energy.

As shown in FIG. 3, a blue organic emission layer 377B is stacked in a vacuous manner on the red organic emission layer 377R, the green organic emission layer 377G, and the hole transport layer (HTL) 373 of the blue pixel (B). The blue organic emission layer 377B is weak with regard to heat caused by laser beams, so a front vacuum deposition method is applied to it instead of using the laser induced thermal imaging method.

An electron transport layer (ETL) 381, an electron injection layer (EIL) 383, and a second electrode 730 are sequentially stacked on the blue organic emission layer 377B, and an encapsulation layer is formed thereon to complete the organic light emitting diode (OLED) display.

Figure 5:
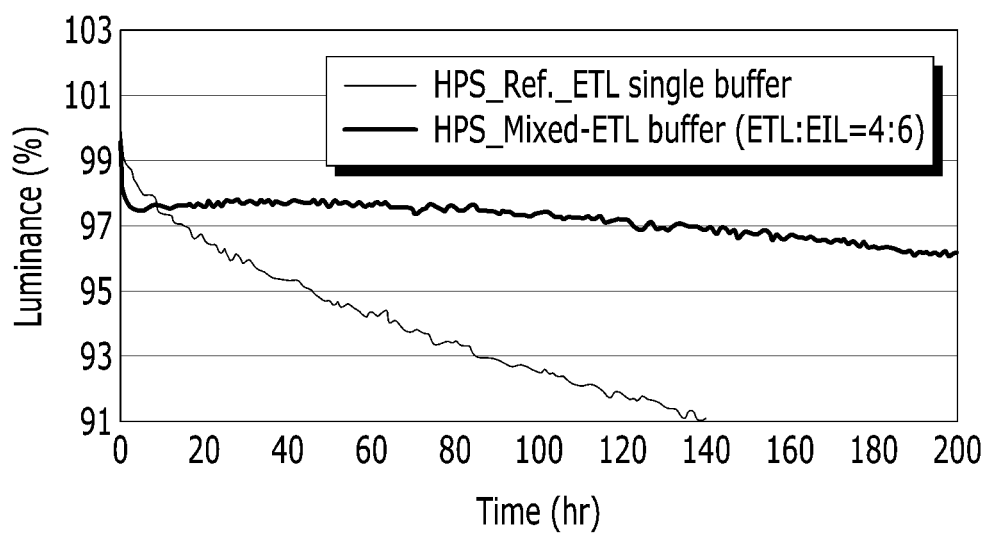
FIG. 5 shows a relationship graph of luminance between an organic light emitting diode (OLED) display according to an example embodiment and a comparative example with respect to time.

FIG. 5 shows a relationship graph of luminance between an organic light emitting diode (OLED) display according to an example embodiment and a comparative example with respect to time.

Regarding the organic light emitting diode (OLED) display, the interlayers 379R and 379G are mixed with an electron transfer material and an electron injection material with a ratio of 4:6, and the comparative example according to the conventional art includes no interlayer.

As shown in FIG. 5, the organic light emitting diode (OLED) display according to the example embodiment slowly reduces the luminance with respect to time compared to the case in which the organic light emitting diode (OLED) display according to the conventional art reduces the luminance.

The organic light emitting diode (OLED) display according to the example embodiment maintains luminance of more than 95% until 200 hours after 140 hours whereas the organic light emitting diode (OLED) display according to the conventional art has reduced luminance of below 91% after 140 hours.

While this disclosure has been described in connection with what is presently considered to be practical example embodiments, it is to be understood that the embodiments are not limited to the disclosed embodiments, but, on the contrary, is intended to cover various modifications and equivalent arrangements included within the spirit and scope of the appended claims.

What is claimed is:

1. An organic light emitting diode display comprising a plurality of pixels, the display comprising:
   a substrate;
   a thin film transistor provided on the substrate;
   a first electrode connected to the thin film transistor;
   an organic emission layer provided on the first electrode;
   a plurality of interlayers provided over the organic emission layer;
   an electron auxiliary layer provided on the interlayers and including an electron injection layer (EIL) and an electron transport layer (ETL); and
   a second electrode provided on the electron auxiliary layer,
   wherein the interlayers comprise a mixture of materials of the electron auxiliary layer, and
   wherein each interlayer corresponds to a pixel and is separated from an adjacent interlayer corresponding to an adjacent pixel that is configured to emit light having a different color from the pixel adjacent to it.

2. The organic light emitting diode display of claim 1, further comprising a resonance auxiliary layer between the first electrode and the organic emission layer.

3. The organic light emitting diode display of claim 1, wherein the interlayers comprise a mixture of the electron injection material of the electron injection layer (EIL) and the electron transfer material of the electron transport layer (ETL) at a ratio of 2:8 to 8:2.

4. The organic light emitting diode display of claim 3, wherein the electron transport layer (ETL) and the electron injection layer (EIL) include at least one of tris(8-hydroxyquinolino)aluminum (Alq3), PBD, TAZ, spiro-PBD, BAlq, SAlq, 2,9-dimethyl-4,7-diphenyl-1,10-phenanthroline (BCP), and 4,7-diphenyl-1,10-phenanthroline (Bphen).

5. An organic light emitting diode display comprising a plurality of pixels, the display comprising:
   a substrate;
   a thin film transistor provided on the substrate;
   a first electrode connected to the thin film transistor;
   an organic emission layer provided on the first electrode;
   a plurality of interlayers provided over the organic emission layer;
   an electron auxiliary layer provided on the interlayer; and
   a second electrode provided on the electron auxiliary layer,
   wherein the interlayers comprise a mixture of a host material of the organic emission layer and the electron auxiliary layer, and
   wherein each interlayer corresponds to a pixel and is separated from an adjacent interlayer corresponding to an adjacent pixel that is configured to emit light having a different color from the pixel adjacent to it.

6. The organic light emitting diode display of claim 5, wherein the electron auxiliary layer includes an electron transport layer (ETL) and an electron injection layer (EIL).

7. The organic light emitting diode display of claim 6, wherein the host material and the electron transport layer (ETL) are mixed at a ratio of 2:8 to 8:2.

8. A method for manufacturing an organic light emitting diode display comprising a plurality of pixels, the method comprising:
 forming a thin film transistor and a first electrode on a substrate;
 forming a donor film including a base film and a transfer layer;
 transferring the transfer layer of the donor film to a first electrode of the substrate with a laser;
 forming an electron auxiliary layer on the transfer layer; and
 forming a second electrode on the electron auxiliary layer,
 wherein the transfer layer includes an organic emission layer and an interlayer formed on the organic emission layer, wherein the interlayer corresponds to a pixel and is separated from an adjacent interlayer corresponding to an adjacent pixel that is configured to emit light having a different color from the pixel adjacent to it, and
 wherein the organic emission layer and the interlayer are formed at the same time during transferring the transfer layer.

9. The method of claim 8, wherein the electron auxiliary layer includes an electron transport layer (ETL) and an electron injection layer (EIL).

10. The method of claim 9, wherein the interlayer is formed by mixing an electron injection material of the electron injection layer (EIL) and an electron transfer material of the electron transport layer (ETL) at a ratio of 2:8 to 8:2.

11. The method of claim 9, wherein the interlayer is formed with a mixture of an electron injection material of the electron injection layer (EIL) and a host material of the organic emission layer.

12. The method of claim 11, wherein the interlayer is formed by mixing the electron injection material of the electron injection layer (EIL) and the host material of the organic emission layer at a ratio of 2:8 to 8:2.

13. An organic light emitting diode display comprising a plurality of pixels, made by the method comprising:
 forming a thin film transistor and a first electrode on a substrate;
 forming a donor film including a base film and a transfer layer;
 transferring the transfer layer of the donor film to a first electrode of the substrate with a laser;
 forming an electron auxiliary layer on the transfer layer; and
 forming a second electrode on the electron auxiliary layer,
 wherein the transfer layer includes an organic emission layer and an interlayer formed on the organic emission layer, wherein the interlayer corresponds to a pixel and is separated from an adjacent interlayer corresponding to an adjacent pixel that is configured to emit light having a different color from the pixel adjacent to it, and
 wherein the organic emission layer and the interlayer are formed at the same time during transferring the transfer layer.

14. The organic light emitting diode display of claim 13, wherein
 the electron auxiliary layer includes an electron transport layer (ETL) and an electron injection layer (EIL).

15. The organic light emitting diode display of claim 13, wherein
 the interlayer is formed by mixing an electron injection material of the electron injection layer (EIL) and an electron transfer material of the electron transport layer (ETL) at a ratio of 2:8 to 8:2.

16. The organic light emitting diode display of claim 13, wherein
 the interlayer is formed with a mixture of an electron injection material of the electron injection layer (EIL) and a host material of the organic emission layer.

17. The organic light emitting diode display of claim 13, wherein
 the interlayer is formed by mixing the electron injection material of the electron injection layer (EIL) and the host material of the organic emission layer at a ratio of 2:8 to 8:2.

18. The organic light emitting diode display of claim 2, further comprising a hole injection layer on the first electrode and a hole transport layer on the hole injection layer, wherein the resonance auxiliary layer is formed between the hole transport layer and the organic emission layer.

19. The organic light emitting diode display of claim 18, wherein the resonance auxiliary layer corresponds to the one of the pixels and is separated from an adjacent resonance auxiliary layer corresponding to the adjacent one of the pixels.

* * * * *